United States Patent [19]

Lisle, Jr. et al.

[11] 3,866,148

[45] Feb. 11, 1975

[54] AMPLITUDE MODULATOR HAVING A TRANSISTOR CONTROLLED BIAS CURRENT

[75] Inventors: Thomas K. Lisle, Jr., Glen Burnie; Joseph Romanchak, Pasadena, both of Md.

[73] Assignee: The United States of America as represented by the Secretary of the Navy, Washington, D.C.

[22] Filed: Nov. 23, 1973

[21] Appl. No.: 418,352

[52] U.S. Cl. .......... 332/31 T, 307/235 R, 330/30 D, 332/43 B

[51] Int. Cl. .......... H03c 1/38, H03c 1/54

[58] Field of Search .......... 332/31 T, 43 B, 44; 307/235 R, 264; 330/30 D

[56] References Cited

UNITED STATES PATENTS

| | | | |
|---|---|---|---|
| 3,571,761 | 3/1971 | Meek et al. | 332/31 T |
| 3,581,222 | 5/1971 | Dunwoodie | 332/31 T |
| 3,646,458 | 2/1972 | Verhoeven et al. | 307/235 R X |
| 3,713,034 | 1/1973 | Schwartz | 307/264 X |

*Primary Examiner*—Alfred L. Brody
*Attorney, Agent, or Firm*—Richard S. Sciascia; Joseph M. St. Amand; David O'Reilly

[57] ABSTRACT

An amplitude modulator capable of 100% modulation with low modulation distortion, adaptable to all practical amplitude modulation requirements from D.C. to 120 MHz. The circuit has a differential amplifier with an R.F. input and a bias current from an ultra-linear, voltage-tuned constant current source which is transistor controlled. The differential amplifier provides full limiting of the R.F. input and is biased with a current source comprised of an operational amplifier with its feedback connected to include the bias current controlling transistor.

4 Claims, 2 Drawing Figures

AMPLITUDE MODULATOR HAVING A TRANSISTOR CONTROLLED BIAS CURRENT

BACKGROUND OF THE INVENTION

This invention relates to amplitude modulators and more particularly to an amplitude modulator having carrier modulation linearly proportional to the amplitude of the signal voltage.

Numerous amplitude modulation circuits employing transistors, tubes and diodes are known in the art. In a transistorized amplitude modulator, a carrier voltage is applied to the base electrode and the transistor gain is varied by biasing the base or collector electrode with a modulating signal. In tube-type circuits, a modulation transformer is frequently employed, which transformer is controlled with the modulation signal at the primary side and varies the magnitude of the effective supply voltage in time with the modulation frequency by means of its secondary voltage. In an amplitude modulator employing diodes, they are connected in a bridge-like configuration and are switched between conducting and non-conducting states by a modulating signal. These circuits suffer for one or more of a variety of disadvantages, such as distortion with high modulation factors, the necessity that the carrier amplitude be relatively constant and, typically, some have relatively narrow bandwidths. The diode modulators are capable of operation over a relatively wide frequency range but they suffer from the disadvantage that the modulation factor varies as a function of the carrier signal amplitude.

SUMMARY OF THE INVENTION

The purpose of the present invention is to provide an amplitude modulator which has a modulation output linearly proportional to the amplitude of the signal voltage, provides full limiting of the R. F. input, and is capable of operation over a very wide bandwidth. The circuit has an R. F. input to a symmetrically operated differential amplifier which has a transistor-controlled, ultra-linear bias current applied to its common emitter connection. The bias current is supplied by an operational amplifier which has the bias current controlling transistor connected in its feedback path. Due to the nature of the differential amplifier, two output phases (0° and 180°) of the modulated signal are available. A simple, tuned output filter connected to either of the output phases can reclaim the fundamental, modulated signal with little difficulty.

OBJECTS OF THE INVENTION

It is one object of the present invention to provide an amplitude modulator having an output modulation, linearly proportional to the amplitude of the signal voltage.

Yet another object of the present invention is to provide an amplitude modulator which has full limiting of the carrier input signal.

Still another object of the present invention is to provide an amplitude modulator capable of operation over a wide bandwidth.

Other objects, advantages, and novel features of the present invention will become apparent from the following detailed description of the invention when considered in conjunction with the accompanying drawings.

DETAILED DESCRIPTION OF THE PREFERRED EMBODIMENT

Figure 1:
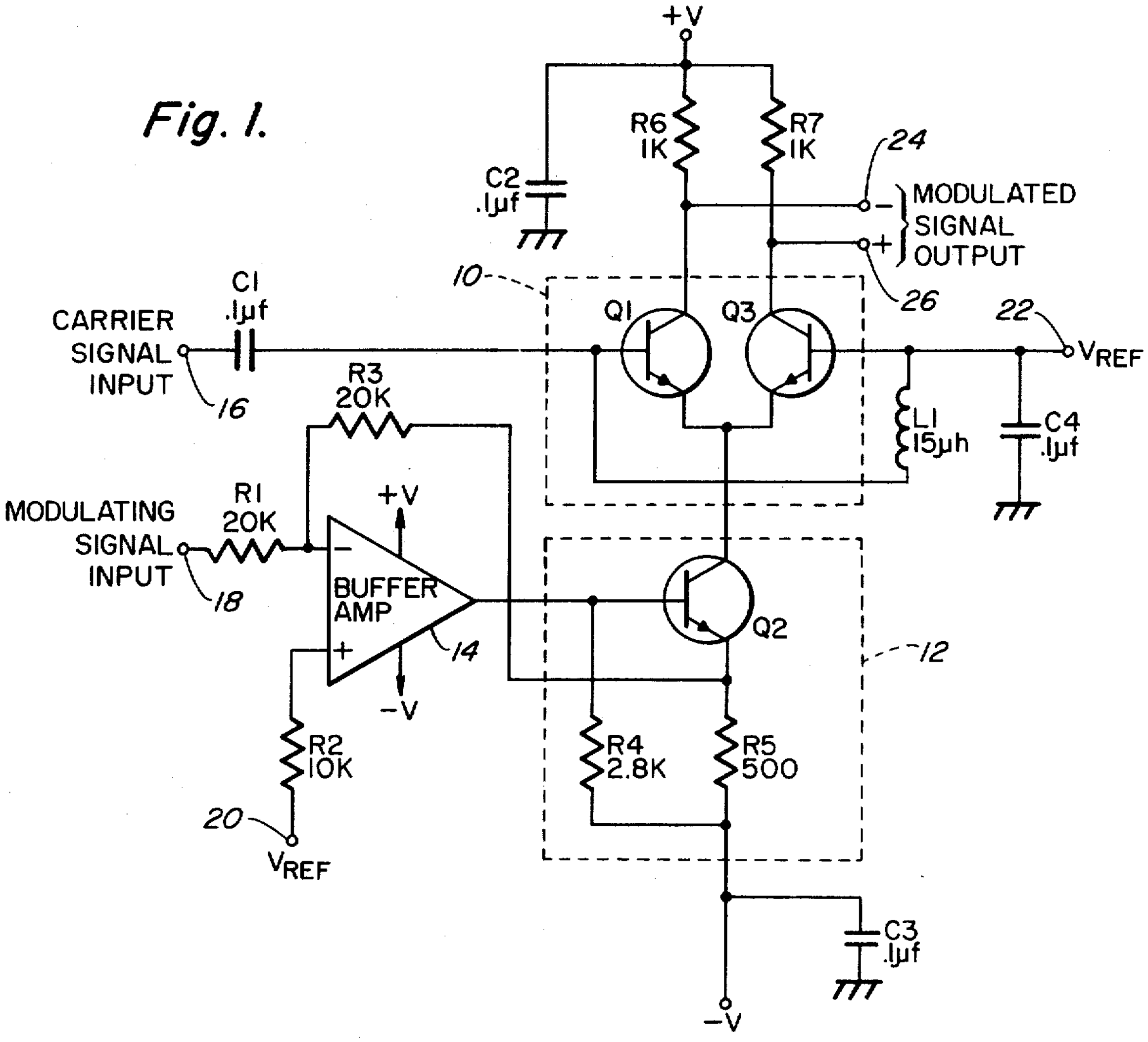
FIG. 1 is a schematic diagram of the amplitude modulator of the present invention.

The amplitude modulator of the present invention is shown in the schematic diagram of FIG. 1 in which the suggested component values are shown merely by way of example. This circuit is comprised of a differential amplifier 10, havings its common emitter connection biased by the transistor-controlled current source 12. The transistor-controlled current source 12 is driven by a buffer amplifiei 14 having the transistor Q2 of the transistorized controlled current source 12 connected it its feedback path. Buffer amplifier 14 is an operational amplifier having its feedback path connected to effectively eliminate the non-linearity of transistor Q2.

The carrier signal input is applied through terminal 16 to the differential amplifier 10 where full limiting takes place. That is, first transistor Q1 on one side of differential amplifier 10, then transistor Q3, on the other side of differential amplifier 10, turns on and off as the carrier signal input swings positive and negative. The amplitude of the output voltage from differential amplifier 10 is determined by the current through collector resistors R6 or R7. This current is set by transistor current source 12, which is voltage controlled. The transistor-controlled current source 12 is driven by buffer amplifier 14 offering relatively high input impedance and low output impedance. The modulating signal input is applied to buffer amplifier 14 through terminal 18. The high input impedance of buffer amplifier 14 has a negligible effect on the modulating signal source and means that smaller coupling capacitors may be used, if needed. Resistor R3 in the feedback path of buffer amplifier 14 is connected to the emitter of transistor Q2, thus effectively eliminating the non-linear characteristics of this transistor. A reference voltage (about −10 volts) is applied to buffer amplifier 14 through terminal 20.

This reference voltage is also applied to the differential amplifier 10 through terminal 22. The reference voltage applied to terminal 22 is applied to both bases of transistors Q1 and Q3 of differential amplifier 10 to provide symmetrical operation. The inductor L1 between the bases of transistors Q1 and Q3 of the differential pair presents a common reference supply voltage but blocks carrier signal excursions from the reference side. Preferably, all supply leads are R. F. by-passed. Since the differential amplifier 10 is symmetrically operated, either one of two outputs at terminals 24, 26 may be selected which are opposite in phase. That is, either a 0° output or a 180° output may be selected from either of terminals 24 or 26.

Figure 2:
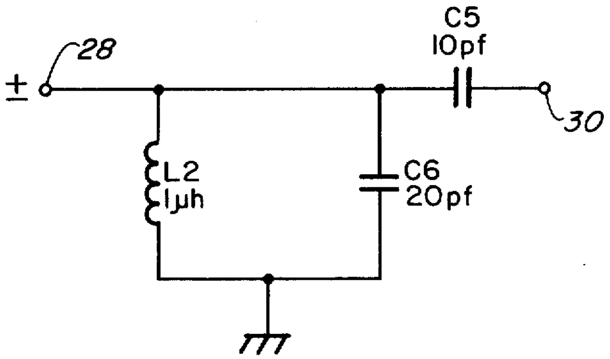
FIG. 2 is a schematic diagram illustrating a simple filter suitable for reclaiming the fundamental frequency of the amplitude modulator of FIG. 1.

A simple filter, such as that shown in FIG. 2, connected to either terminals 24 or 26, can reclaim the fundamental frequency from the normal modulated signal output. Terminal 28 of the filter shown in FIG. 2. may be connected to either the terminal 24 or 26, depending upon whether the 0° or the 180° phase is desired. A load may be connected to terminal 30 and, if purely resistive, the output will be a square wave.

The amplitude modulator disclosed is fundamentally a differential amplifier with a transistor controlling the bias current in the following manner. When the gain. of the differential amplifier 10 is increased, it becomes an amplitude limiter with a limit level precisely defined by the bias current only. In other words, the peak swing of the limited signal is a direct function of the bias current. In looking at the current controlling transistor Q2 of the transistor-controlled current source 12, it is apparent that the current is directly proportional to the voltage on the emitter of Q2. Since it is not convenient to drive that point directly, a buffer amplifier 14 is introduced to produce a voltage-controlled, linear-tuning, current source. By connecting the feedback of the buffer amplifier 14 to include transistor Q2, the non-linearity of that transistor is eliminated, resulting in much lower distortion of the modulation frequency.

The resulting amplitude modulator is capable of 0 – 100 percent modulation with input limiting of undesired AM, but little effect upon input FM. The modulation signal source is buffered and may be of any frequency down to D.C., while the carrier signal may be greater than 100 MHz. Since the modulator operates as a limiter, the carrier signal input need not be constant amplitude to yield a constant output.

An additional advantage is that the modulator can be constructed with non-critical components and is adaptable to all practical amplitude modulation requirements. Two readily available, integrated circuits can simplify fabrication. An RCA integrated circuit, part number CA3028A, can provide the functions of differential amplifier 10 and transistor-controlled current source 12. Buffer amplifier 14 is an operational amplifier and can be a Fairchild integrated circuit, part number μA741 or its equivalent. This modulator is an important improvement in that the percent modulation of the carrier is linearly proportional to the amplitude of the modulating signal voltage, thus providing very low modulation distortion. Tests of the circuits disclosed in FIG. 1 reveal that modulation distortion was found to be considerably less than 1 percent for 75 percent amplitude modulation.

Thus, there has been disclosed an amplitude modulator capable of operation over a wide bandwidth which has low distortion and full limiting, thus eliminating the need for a constant carrier signal input. While the embodiment shown in FIG. 1 is preferred, there are alternatives. For example, for voltage control a back biased zener diode can be connected between transistor Q2 and buffer amplifier 14 with feedback of the latter connected directly to the output. The zener diode will provide voltage translation, allowing direct coupling between the output of buffer amplifier 14 and the current source transistor Q2. This variation, however, is not as effective in eliminating the non-linearity of transistor Q2 as the embodiment shown in FIG. 1.

Obviously many modifications and variations of the present invention are possible in light of the above teachings. It is therefore to be understood that within the scope of the appended claims the invention may be practiced otherwise than as specifically described.

We claim:

1. An amplitude modulator having low modulation distortion comprising:

a. a common-emitter differential amplifier;

b. means for applying a carrier signal to said amplifier;

c. means for applying a reference voltage to said amplifier;

d. a transistor having its collector junction connected to the common emitter connection of said amplifier for biasing said amplifier with a voltage-controlled, linear-tuning, constant current modulation signal;

e. an operational amplifier connected to the base of said transistor, the feedback path of said operational amplifier being coupled to the emitter of said transistor whereby the non-linearity of said transistor is eliminated.

2. The amplitude modulator of claim 1 wherein the means for applying a reference voltage to said differential amplifier includes means connected between the bases of the differential amplifier for blocking carrier excursions from the reference side.

3. The amplitude modulator of claim 2 wherein the means for blocking excursions of the carrier signal is an inductor.

4. The amplitude modulator of claim 3 wherein filter means for reclaiming the fundamental carrier frequency is connected to one collector electrode of said differential amplifier.

* * * * *